US007196337B2

(12) United States Patent
Mikolas (10) Patent No.: US 7,196,337 B2
(45) Date of Patent: Mar. 27, 2007

(54) PARTICLE PROCESSING APPARATUS AND METHODS

(75) Inventor: David G. Mikolas, Rowland Heights, CA (US)

(73) Assignee: Cabot Microelectronics Corporation, Aurora, IL (US)

( * ) Notice: Subject to any disclaimer, the term of this patent is extended or adjusted under 35 U.S.C. 154(b) by 302 days.

(21) Appl. No.: 10/829,841

(22) Filed: Apr. 22, 2004

(65) Prior Publication Data

US 2004/0238753 A1 Dec. 2, 2004

(51) Int. Cl.
*G01N 23/00* (2006.01)
*H01J 49/10* (2006.01)

(52) U.S. Cl. .................. 250/423 R; 250/426; 250/427; 250/493.1; 250/396 R; 313/363.1; 315/111.81; 315/111.31; 315/111.01

(58) Field of Classification Search ............ None
See application file for complete search history.

(56) References Cited

U.S. PATENT DOCUMENTS 3,740,554 A * 6/1973 Morgan, Jr. ............ 250/423 R
4,536,657 A * 8/1985 Bruel ....................... 250/492.2
6,974,950 B2 * 12/2005 Leung et al. .............. 250/251

OTHER PUBLICATIONS

Patrick T. Spicer et al.; Dept. of Chemical Engineering, University of Cincinnati, Cincinnati, Ohio; "Flame synthesis of Composite carbon black-fumed silica nanostructured particles";*J. Aerosol Sci.*, vol. 29, No. 5/6, pp. 647-659; (1998) Elsevier Science Ltd., Great Britain.

Hendrick K. Kammler et al., Institut fur Verfahrenstechnik, ETH Zentrum, Zurich, Switzerland; "Electrically assisted flame aerosol synthesis of fumed silica at high production rates"; *Chemical Engineering and Processing* 39 (2000) 219-227; Elsevier Science S.A.

Sotiris E. Pratsinis; Dept. of Chemical Engineering, University of Cincinnati, Cincinnati, Ohio; "Flame aerosol synthesis of ceramic powders"; *Prog. Energy Combust. Sci.*, vol. 24, pp. 197-219; (1998) Elsevier Science Ltd., Great Britain.

Herbert Barthel et al., Wacker-Chemie GmbH, Werk Burghausen, Germany; "Particle sizes of fumed silica" (Abstract); *Particle and Particle Systems Characterization*, vol. 16, Issue 4; pp. 169-176; (1999) Elsevier Science B.V.

Abstracts of the 1995 International Conference on Aerosol Science and Technology: Robert S. Windeler et al.; Air Quality and Aerosol Technology Laboratory, Dept. of Chemical Engineering, University of California, Los Angeles, California, US; "Nanometer particles and their agglomerates" Sotiris E. Pratsinis; Dept. of Chemical Engineering, University of Cincinnati, Cincinnati, Ohio; "Aerosol manufacture of powders: the role of gas mixing and corona discharge during flame synthesis of TiO2 and SiO2" J. Aerosol Scie., vol. 27, No. 4, pp. 645-661; (1996) Elsevier Science Ltd., Great Britain.

(Continued)

*Primary Examiner*—Nikita Wells
(74) *Attorney, Agent, or Firm*—Thomas Omholt; Blair Hughes (57) ABSTRACT

This invention relates to an apparatus for processing particles. The apparatus comprises a particle source having an exist aperture; an extraction electrode located at the exist aperture; an acceleration electrode adjacent to the extraction electrode; a processing compartment adjacent to the acceleration electrode; and a deceleration electrode located adjacent to the processing compartment. The invention also relates to methods of processing particles and to particles processed by the apparatus and methods of the invention.

8 Claims, 4 Drawing Sheets

OTHER PUBLICATIONS

Richard G. Osifchin et al.; "Synthesis of nanoscale arrays of coupled metal dots"; *Nanotechnology* 7 (1996) 412-416, IOP Publishing Ltd., UK.

Stephen J. Riley et al.; Chemistry Division, Argonne National Laboratory, Argonne, Illinois ; "The chemistry of isolated transition metal clusters"; *SPIE* vol. 669 Laser Applications in Chemistry (1996).

Heiko Briesen et al.; "The effect of precursor in flame synthesis of $SiO_2$"; *Chemical Engineering Science*, vol. 53, No. 24, pp. 4105-4112; (1998) Elsevier Science Ltd., Great Britain.

Rasit Koc et al., Department of Mechanical Engineering and Energy Processes, Southern Illinois University, Carbondale, Illinois; "Synthesis of $\alpha$-$Si_3N_4$ from carbon coated silica by carbothermal reduction and nitridation"; *Journal of the European Ceramic Society* 18(1998) 1471-1477; (1998) Elsevier Science Limited, Great Britain.

F. Lencart-Silva et al.; "Carbothermal reduction and nitridation of silica: nuclei planar growth controlled by silicon monoxide diffusion on the reducer surface"; *Journal of Materials Processing Technology* 92-93; pp. 112-117; (1999) Elsevier Science S.A.

P.B. Sunderland et al., "Effects of Structure and Hydrodynamics on the Sooting Behavior or Spherical Microgravity Diffusion Flames"; NASA Lewis Research Center, Cleveland, Ohio (2001).

School of Engineering and Applied Science, Washington University in St. Louis; *Advanced Powder Synthesis Laboratory*, (2000); Chemistry (3 pp.); Thermodynamics (8 pp.); Particle Encapsulation (3 pp.); Consolidation (3 pp.); and Sodium Halide Reactor (2 pp.).

Choon-Gi Choi; Component Technology Development Department, Electronics and Telecommunications Research Institute; Taejon, Rep. of Korea; "Characterization of borophosphosilicate glass soot fabricated by flame hydrolysis deposition for silica-on-silicon device applications"; *Journal of Materials Science* 34 (1999) 6035-6040; Kluwer Academic Publishers.

Sotiris E. Pratsinis et al.; Dept. of Chemical Engineering, University of Cincinnati, Cincinnati, Ohio; "Competition between gas phase and surface oxidation of $TiCl_4$ during synthesis of $TiO_2$ particles"; *Chemical Engineering Science*, vol. 53, No. 10, pp. 1861-1868; (1998) Elsevier Science Ltd., Great Britain.

* cited by examiner

PARTICLE PROCESSING APPARATUS AND METHODS

FIELD OF THE INVENTION

This invention relates to an apparatus for processing particles generated by a particle generation system. The invention also relates to methods for processing particles using the apparatus of the invention as well as to particles prepared by the apparatus and methods of the invention.

DESCRIPTION OF THE RELATED ART

Structured particles, i.e., particles having specifically designed physical and/or chemical properties, are useful for many applications, such as magnetic particles for MRI imaging, fluorescent particles for in vivo tracking, for use in photosynthetic and photovoltaic applications, in catalysis as supports or as catalysts, in optical applications, in paints and pigments, in cosmetics, and in many other applications.

Current methods for producing structured particles are limited, however, in their ability to provide control or modulation of the physical, optical and/or chemical properties of the particles.

Chemical techniques for preparing particles include colloidal aqueous chemistry. Colloidal techniques are useful for the production of metal particles. The techniques can also be used to form dielectric particles, but the density of the resulting glass particles is frequently lower than that of bulk particles. Moreover, thermal processing of particles recovered from colloidal suspensions tends to result in agglomeration, which is undesirable.

Flame hydrolysis deposition (FHD) is used to manufacture dielectric particles such as metal and semimetal oxides. FHD provide bulk particles whose structure and properties are controlled primarily by the flame source. Once the particles have formed and exited the flame, there is little further process control of the particle structure.

There exists a need, therefore, for techniques and methods that allow the control and/or modification of the physical, chemical and/or optical properties of particles.

SUMMARY OF THE INVENTION

The invention provides an apparatus for processing particles comprising: a particle source having an exit aperture; an extraction electrode located adjacent to the exit aperture; an acceleration electrode located adjacent to the extraction electrode; a processing compartment located adjacent to the acceleration electrode; and a deceleration electrode located adjacent to the processing compartment.

The invention also provides methods of processing structured particles, and methods of forming thin films made of structured particles deposited on a substrate. Processing of particles can be conducted with minimal contact between particles being processed.

The invention further provides structured particles processed by the apparatus and methods of the invention.

DESCRIPTION OF THE CURRENT EMBODIMENT

This invention provides apparatuses and methods for controlling or modifying the physical, chemical and/or optical properties of particles produced by a particle generation system. This invention further includes particles manufactured by the methods and apparatuses of this invention. As described in more detail below, in the methods of this invention, particles are extracted from a particle source and are accelerated towards a processing chamber. The particles, which carry a finite charge, are accelerated towards the processing chamber by electric fields. In the processing chamber, the particles are structurally and/or chemically modified. The processing can involve cooling, heating, or maintaining temperature, inducing melting, structural annealing, coating, doping, and surface cleaning among others. One advantage of this processing method is that the particles are inhibited from contacting each other during processing so that no or minimal agglomeration occurs. A sequence of orifices and vacuum pumps promotes separation of the particles in the process or carrier gasses emerging from the particle source.

Processed particles emerging from the processes or apparatuses of this invention can then be decelerated to a desired final velocity where they are deposited on a surface while they are hot and can adhere to each other, or are collected in a container at ambient temperature. If the motion of the particles is parallel to the earth's surface, gravity can be used for coarse charge to mass ratio selection. Certain combinations of the AC components on the electric fields can also perform coarse selection of charge to mass ratio.

DEFINITIONS

As used herein, the term "particle" refers to a plurality of atoms and/or molecules bound together in such a way as to have an internal structure similar to bulk material. Smaller particles are also known as "atomic clusters" or "molecular clusters." Particles processable by the apparatus of the invention are made of any material which forms particles, including organic and metalorganic materials, inorganic oxides such as $SiO_2$, $TiO_2$, $Fe_3O_4$, and $In_2O_3$; metals, including noble metals such as Au, Ag, Pd, Pt; and other compounds such as Si, CdSe, and CdS. Particles may be composed of a single material, or they may be layered, such as thin layers of metal on oxides or polymers, or oxide or polymer layers on metals or other materials. The particles are typically between about 3 nanometers to about 1 micron in diameter, but they may be smaller or larger and still be processable in the apparatus of the invention.

As used herein, the term "charged particles" refers to particles that carry a significant electric charge. The charge on a particle can be induced in the particle source, and can be continuously altered at any other point within the apparatus through processes such as charge transfer with, and absorption and emission of other charged species.

As used herein, the term "neutral particle" refers to particles that carry no charge, or a charge so small that interaction with an electric or magnetic field and other charged species is indistinguishable from those with particles of no charge.

As used herein, the term "ion" refers to positively or negatively charged atoms, as well as positively or negatively charged molecules.

As used herein, the term "charged species" encompasses either charged particles, electrons, or positively or negatively charged ions, or combinations thereof.

The Apparatus

Figure 1:
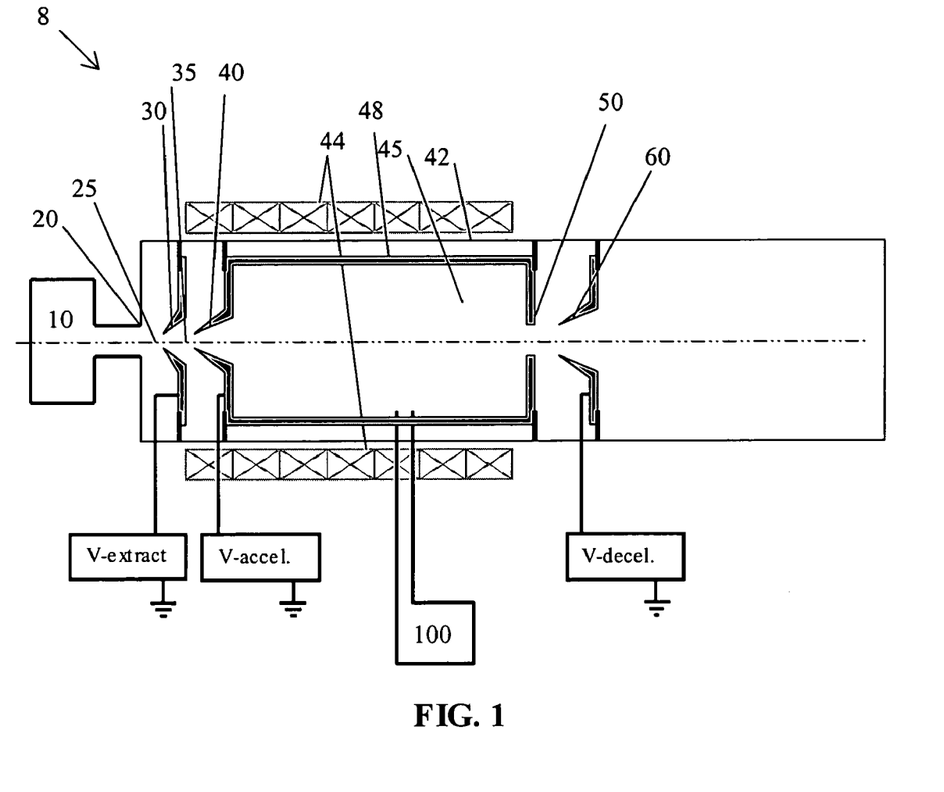
FIG. 1 is a schematic diagram illustrating the major electrical components of the apparatus of the invention, including apertures, magnetic coils, and microwave source.

One embodiment of the apparatus of the invention is depicted in FIG. 1. This embodiment is designed to provide a great degree of flexibility in accommodation of particle source type, the nature of the particle processing, and the final end-use of the particles.

Referring now to FIG. 1, the apparatus 8 comprises a particle source 10, an extraction electrode 30, an acceleration electrode 40, a processing compartment 45 and a deceleration electrode 60.

Particle source 10 provides the particles that are processed by the apparatuses of the invention. The particles may be generated within particle source 10 (in situ generation). Examples of an in situ particle source 10 include, but are not limited to, a flame hydrolysis generator, a plasma generation system, or a laser ablation system. Alternatively, particles may be generated elsewhere (ex situ generation) and then transferred to particle source 10, in which case particle source 10 functions as a particle delivery system. Particle source 10 can contain a storage receptacle (not shown) for holding ex situ generated particles. Ex situ particle generation processes include sputtering, laser ablation into a vacuum, a gas or a liquid, particle generation by colloidal chemistry, gas phase nucleation, or particle generation by direct mechanical means.

Particles exit particle source 10 through aperture 20. Ex situ generated particles can be carried through aperture 20 by expansion of a carrier gas, by gravity, by some other physical, electrical or mechanical phenomenon, or by the electric field from an extraction electrode 30. In situ generated particles generally exit aperture 20 under their own velocity imparted by the production phenomenon, and/or are carried along with other reaction products by expanding gases, by gravity, and/or by the electric field from the extraction system. The particles emerging from exit aperture 20, whether generated in situ or ex situ, can be neutral particles, or charged particles.

An extraction electrode 30 is used to extract the particles and other charged species from the aperture 20. Through structural design of the aperture and control of AC and DC components of bias, the system can be optimized for the size of extracted particles and to reject electrons or certain other potentially undesired charged species. Extraction electrode 30 is typically located between exit aperture 20 and an acceleration electrode 40. The distance between extraction electrode 30 and exit aperture 20 is typically between about 1 and about 10 centimeters. This distance is defined as the extraction gap 25. Extraction electrode 30 can be any extraction device known in the art, including a conducting mesh or aperture in a shaped conducting electrode. Extraction electrode 30 is biased with a superposition of AC and DC electric potential with respect to particle source 10, resulting in an electric field between the exit aperture 20 of the particle source 10 and extraction electrode 30 (i.e., in the extraction gap) which facilitates the extraction of a mixture of charged species and transports them, or some selected subgroup, towards acceleration electrode 40. The potential of the extraction electrode 30 minus the potential of the particle source exit aperture 20 is defined as the extraction potential. Gas expanding through exit aperture 20 can also contribute to the transport of charged species as well as neutral particles towards acceleration electrode 40.

The value of the DC and AC components of the extraction potential, as well as the frequency chosen for the AC component, all contribute to the nature of the extraction process and the types, quantities, and resulting velocity distributions of charged species and particles extracted.

For example, depending on the distance between the exit aperture and the extraction electrode, a simple positive DC extraction potential of +10 to +10,000V extracts primarily electrons, negative ions, and negatively charged particles, while a negative DC extraction potential of −10 to −10,000V extracts primarily positive ions and positively charged particles.

During extraction, a crude selection of particle mass can be achieved by manipulating the extraction potential. For example, for a gap of 1 centimeter between source 10 and extraction electrode 30, a purely AC extraction potential of very high frequency (several hundred Megahertz or greater) results primarily in the extraction of electrons. This is because all other charged species and particles tend to exhibit only small oscillations (from a fraction of a millimeter to less than a micron) about a fixed point resulting from their small charge to mass ratio. As a consequence, the species and particles' response time is slow. At a lower frequency of 5 to 50 MHz, both electrons and light positive and negative ions (such as $H^+$, $H^-$, $He^+$, etc.) may be extracted. As the frequency is lowered to about 1 MHz, increasingly heavier ions (such as ionized $SiO_2^{+/-}$, $Au^{+/-}$, where +/− indicates either positive or negative charged) can also be extracted along with the light ions and electrons. At still lower frequencies, light atomic clusters can be extracted. Extraction of singly charged particles made of 13 atoms of gold, for instance, (the first closed nanoparticle "shell" for noble metals) will begin as the frequency is lowered from about 1 MHz to about 100 kHz. Practical extraction of larger particles having relatively high charge to mass ratio, such as silicon particles with a charge to mass ratio of the order of $10^{-4}$ charges/atom (10 Coulomb/mole; 300 Coulomb/kg) occurs between 10 and 100 kHz, while extraction of relatively low charge to mass ratio particles, such as gold particles at $10^{-6}$ charges/atom (0.1 Coulomb/mole; 0.5 Coulomb/kg), occurs between 0.3 and 3 kHz. In each of the cases above, extraction of all species with a charge to mass ratio higher than the species described also occurs. In addition, for a predominantly AC extraction potential, in each case above, extraction of both signs of charge can occur.

It is important to note that independent of the nature of the extraction potential, neutral atoms and molecules and neutral particles may also pass through the extraction electrode and into acceleration gap 35 beyond. This region is likely to have significantly reduced pressure, and gas will expand in all directions once it has entered this volume. The particles, being much heavier and too far apart to scatter amongst themselves, will tend to continue to move in the forward direction. Thus the opening in the extraction electrode will also serve as an orifice to preferentially pass the heavier particles, while blocking most of the expanding cloud of gas which is then pumped away by vacuum pumps 110 discussed below. Besides extraction of particles by electrodes as described above, extraction may be also driven by a number of alternative mechanisms, including differential gas pressure, mechanical methods, and even gravity if the apparatus is oriented properly.

Acceleration electrode 40 accelerates the charged species extracted by extraction electrode 30 from particle source 10.

Acceleration electrode 40 is located between extraction electrode 30 and a processing compartment 45 and is about 1 to about 15 cm downstream (in the direction of flow of the particles) of extraction electrode 30.

Electrode 40 can be any electrode known in the art to function as an acceleration electrode for charged species, including a conducting mesh or aperture in a shaped conducting electrode. Acceleration electrode 40 is biased relative to extraction electrode 30. The acceleration potential is defined as the potential of the acceleration electrode 40 minus the potential of the extraction electrode 30. A power supply is used to bias the electrode appropriately. The value of the acceleration potential is used primarily to control the velocity of the particles as they enter and travel through the processing compartment 45. The acceleration potential is typically the same sign as the extraction potential. If very fast particles having short processing times are required, the magnitude of the acceleration potential is large, from about 10,000 to about 400,000 Volts. In some cases, very slow particles are desired in order to obtain very long processing times. In these cases the magnitude of the acceleration potential may be small, from about 100 Volts to about 10,000 Volts, or even of the opposite sign than the extraction potential in order to slow the particles. The signs may also differ if the sign of the charge on the particle also changes from the extraction environment to the lower pressure acceleration gap. In other embodiments, the acceleration may be accomplished by the force of gravity, by expanding gas or by other means.

Acceleration of particles to a high velocity reduces their residence time in the apparatus. Without any acceleration, particles from the particle source 10 travel at about 100 to about 1000 meters per second due to thermal motion and gas expansion. Accelerated particles can reach a velocity of the order of $10^5$ meters/sec with an acceleration potential of 400,000 Volts. By substantially increasing the velocity of the particles, the residence time in processing compartment 45 can decrease from a few milliseconds to roughly 10 microseconds. While radiative cooling of nanoparticles is difficult to predict since the blackbody model does not apply, it is estimated that a particle with a diameter of 1 micron and a temperature of 1000° C. traveling at such high velocity will cool by less than 100° C. traveling a distance of 1 meter through the apparatus. Consequently, without further heating, the particles can have a temperature at the output similar to that at the input. In addition, by having less time and thus less opportunity to evolve structure or composition (such as crystallization, segregation, loss of material due to sublimation, etc.) the particles at the output can be similar in structure and composition to the particles at the input.

At very low velocity the transit time of particles over a distance of 1 meter can approach 100 milliseconds, and assuming that the apparatus is oriented horizontally, the particle in free fall in the earths gravity will drop by about 5 centimeters. If either a narrow distribution in the ratio of charge to mass can be achieved, or what those knowledgeable in the art of charged particle transport understand as an equilibrium charge state distribution is achieved with frequent charge-changing events, then the vertical drop of the particles is proportional to mass. A moveable exit aperture can then be used to select particle mass.

Another application of long processing time is to allow for low pressure gas phase chemical reactions, either to form additional layers or to remove or clean the particles surface.

In an alternative method for achieving even longer process times, the axis of the apparatus can be oriented vertically and the accelerating force can be free fall under gravity. In this case, transit of a 1 meter long processing compartment is nearly a half of a second.

Additionally, the application of AC components along with the DC extraction and acceleration potentials can improve the opportunity for mass selection with better control than just an AC component on the extraction potential alone. Those skilled in the art of particle acceleration will recognize that multiple gaps with individually adjustable AC components can be configured to select the charge to mass ratio of particles with better control than a single gap. Light particles such as the singly charged 13 atom gold nanoparticles accelerated by traveling through a moderate acceleration potential of 10,000 V over 10 centimeters traverse the gap in about 1 microsecond, and slow, heavy particles such as gold nanoparticles with a charge to mass ratio of the order of $10^{-6}$ charges per atom accelerated through a potential difference of 100 Volts require about 20 milliseconds to traverse the same gap. Electrons, even if accelerated by a potential difference of only 1 Volt, traverse the same gap in only about 300 nanoseconds. Thus, by adjusting the waveform and frequency of the varying potential between the two electrodes, the system can be optimized to select or block charged species of different charge to mass ratios.

Acceleration electrode 40 can also be used to accelerate any additional charged species introduced into the extraction or acceleration volume by a second electron or ion source, or from the particle source itself. If these charged species are sufficiently energetic and intense, they may serve to heat or otherwise modify the particles without any additional means such as magnetic fields or microwaves, or to alter or maintain a desired level of charge, as discussed below.

Acceleration electrode 40 may also function as an orifice, preferentially separating the heavier particles carried forward by momentum from the more isotropically expanding gas emerging from the extraction electrode which is then removed by a vacuum pumping system, in a manner similar to that described for the extraction electrode. Those skilled in the art of vacuum system design will recognize this as a dual differentially pumped system.

Figure 2:
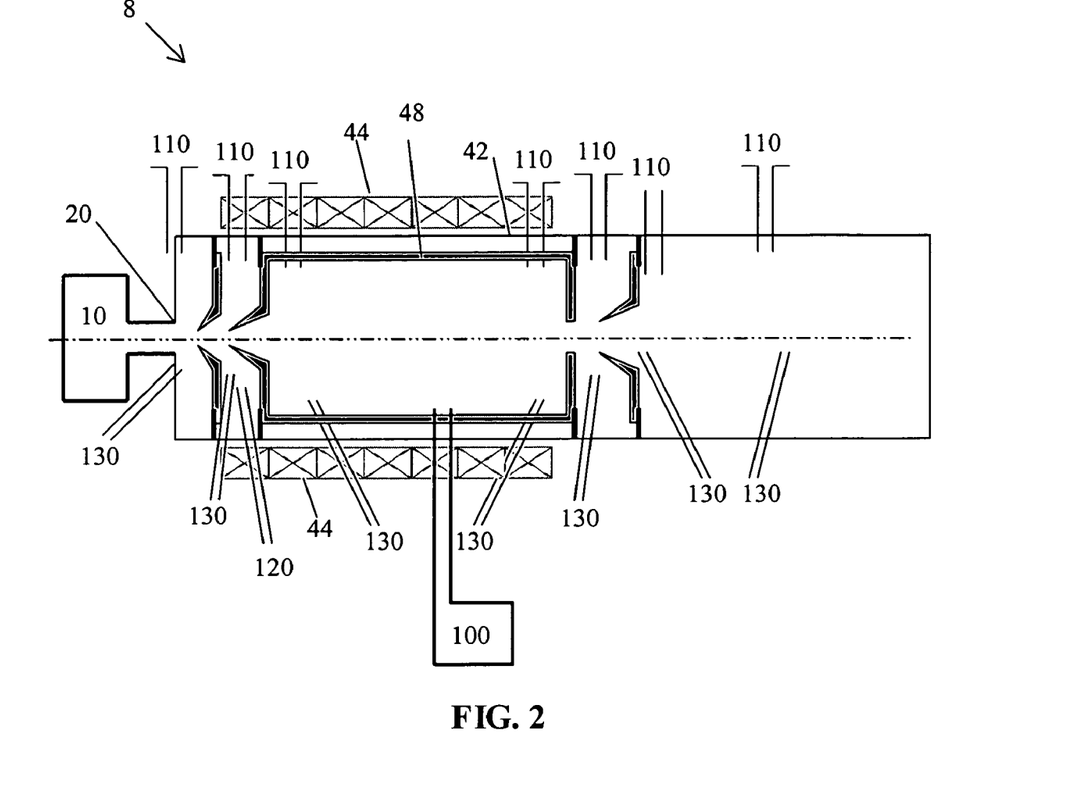
FIG. 2 is a schematic diagram of the apparatus illustrating the major components of the processing compartment of the apparatus.

Adjacent and downstream from the acceleration electrode 40 is processing compartment 45, in which further manipulations of the particles can be conducted. Processing compartment 45 includes components which may be operated together in various combinations to process the particles during their transit through the processing compartment. These components include an electron or ion source 120, a vacuum chamber 42, one or more gas sources 130, vacuum pumps 110, a conductive liner 48, a plurality of magnetic coils 44, and a microwave supply 100. These components are shown in FIG. 2.

Electrons and ionized atoms and molecules (ions) may be present in the acceleration gap both from the particle source and or may be introduced by an electron and/or ion source 120. These electrons and ions are accelerated by the acceleration electrode and emerge into the processing compartment 45 where they can contribute to the processing of the particles in various ways.

Collisions with energetic electrons presents a mechanism to replenish thermal energy to the particles and can be used to slow cooling, maintain a given temperature, or even substantially heat the particles depending on electron energy and rate of collision. Electron collisions can also be used to control the average charge state, distribution of charge states, and frequency of charge-changing of the particles. Lower energy electrons tend to add negative charge while higher energy electrons, roughly above 1 keV in energy, tend to scatter more electrons and impart a net positive charge.

Energetic electron bombardment can also break chemical bonds, especially organic bonds, and can induce molecular re-arrangement or annealing. Electron bombardment combined with the presence of certain gasses can also deposit films. For example carbon-containing films can be deposited on surfaces in proximity to energetic electrons where the ambient atmosphere contains even a low partial pressure of the order of $10^{-6}$ Torr of organic molecules.

Ion bombardment is a technique for densification of dielectric films during a deposition process to achieve films with properties approaching those of the bulk. For singly charged ions accelerated by a fixed potential, those with low atomic numbers will have a greater penetration depth. While protons are the lightest ions, they pose a safety issue because of the hydrogen and hydrogen-containing gasses, a contamination issue for exposed surfaces of the apparatus, may pose unwanted chemical reactivity, and may readily incorporate into the particles themselves. One preferred ion for ion bombardment is helium.

Helium is a safe, non-reactive, easily obtainable and stored gas. Energetic Helium ions implanted in particles will rapidly out-diffuse either under ambient conditions or slightly elevated temperature.

Vacuum chamber 42 is made of a structural metal such as aluminum or stainless steel. Chamber 42 is preferably between about 0.5 meters and about 2 meters long, and between about 0.2 meters and about 1 meter or more in diameter. The chamber can be any combination of these lengths and diameters, the dimensions determined by optimization for a given application and minimization of cost. Chamber 42 can be of any shape within these dimensions. Preferably the chamber is cylindrical or rectangular. The vacuum chamber may extend to surround the particle source as well as the final destination of the particles, or connect to separate chambers surrounding those components.

The reduced pressure provided by the vacuum system is produced by one or more vacuum pumps 110 evacuating the vacuum chamber. Vacuum pump(s) 110 lower the absolute pressure of the chamber, and remove unwanted contaminant species from the remaining gas. Unwanted contaminant species may include atmospheric components such as oxygen (an oxidizer) nitrogen (also reactive at elevated temperatures) as well as trace environmental components such as water. For example, if hot silica particles with a diameter of 50 nanometers have a charge to mass ratio of the order of $10^{-6}$ charges per molecule and are accelerated by 1,000 Volts and then traverse 1 meter, they will spend about 20 milliseconds in the environment. If the vacuum were poor, $10^{-3}$ Torr for example, and of atmospheric composition, then they would be struck by about 100,000 Nitrogen molecules, enough to form roughly 7 molecular monolayers and increase the mass by about 10% if they were all to adhere to the silica particle. If only 1% were to react with the hot $SiO_2$ surface and make some form of silicon oxynitride by a reaction driven by the high temperature of the particle or an energetic electron or ion striking the surface, a resulting bulk material formed from these particles would have an index of refraction shifted by approximately+0.002, an amount which would be undesirable for many optical application if not carefully controlled.

The purpose of the reduced absolute pressure is to allow the particles to move without substantial friction, cooling, or other interaction with the atmosphere. The reduced pressure also allows the efficient maintenance of energetic electrons and ions as part of the processing of the particle.

A gas source 130 located in the processing compartment can introduce a small amount of gas into the processing compartment. This gas can serve a number of different needs depending on how the apparatus is operated. For instance, the gas may be used in surface reactions and surface cleaning. The gas may also be used to support electron multiplication (collisions of gas atoms with energetic electrons can produce more electrons) as well as support the formation of a plasma discharge when excited by a microwave source 100 (discussed below). The gas may provide atomic species which are accelerated by the microwave source and then strike the particles, either to induce annealing of the particle structure or remain implanted within the particle.

Gas sources 130 may be introduced within, as well as ahead or after the processing compartment for purposes of reaction, charge changing, particle cooling or slowing. These are placed as needed for a particular application.

Located inside the structural walls of vacuum chamber 42 is a conductive liner 48 which provides a constant average DC potential for the processing compartment. It prevents accumulation of charge from electrons and ions, and provides a cavity which can be excited by the microwave generator 100 described below. The high conductivity liner is preferably made with the internal surface structure including a layer of copper or silver thicker than many skin-depths of the lowest frequency of microwaves to be used.

Magnetic coils 44 generate a predominantly solenoidal magnetic field within the processing chamber. They are preferably made of a high conductivity material such as copper, and are driven by independently controlled current supplies. Superconducting coils may be used if a high magnetic field (many kilogauss) is required in a large volume of space. For example, singly ionized helium-4, accelerated by a potential difference of 100 Volts can be confined to a helical orbit with a diameter of 1 centimeter or less by a magnetic field of about 0.6 Tesla or about 6 kilogauss. This field strength approaches the upper limit of practicality for conventional water-cooled copper coils, but is easily achieved with a commercial superconducting solenoid cooled with commercially available liquid Helium.

Magnetic coils 44 may be of any shape but are preferably circular, centered on the axis of the apparatus, each falling in a plane perpendicular to the axis. Magnetic coils 44 are spaced at approximately equal intervals so that a magnetic field can be formed along the axis of the apparatus in a substantial fraction of the processing compartment.

Collisions of the particles being processed with energetic electrons presents a mechanism to replenish thermal energy to the particles which can be used to slow cooling, maintain a given temperature, or even substantially heat the particles depending on electron energy and rate of collision. The predominantly axial magnetic field can confine electrons to the same region as the particles, increasing probability of collision. For example, a field of 0.1 Tesla (1 kilogauss) can be readily produced by standard water-cooled copper coils within a volume of space of the scale described here. In this magnetic field, electrons accelerated by a potential of 20,000 Volts are confined to helical trajectories with a diameter of 1 centimeter or less. Electrons accelerated by only 200 Volts will be confined to helical orbits of 1 millimeter or less in diameter. These orbits are sufficient to provide many opportunities for a single electron to collide with a particle while the particle passes through the processing compartment.

The nature of a solenoidal magnetic field is such that as charged particles enter the field, they are concentrated near the axis and maintained there in helical orbits. This phenomenon helps concentrate and confine electrons and ions to the same path as the particles. As the electrons and ions exit the solenoidal field, the field lines diverge and the electrons and low energy ions tend to be pulled away from the axis while the particles, with typically tens of thousands of times smaller charge to mass ratio continue forward essentially unaffected. This effect can be used as a separator, allowing the particles to pass through the processing compartment exit aperture while inhibiting other charged species from following.

Magnetic coils 44 may be independently controlled and adjusted so that different magnetic field strengths are present at different locations along the axis of the processing compartment. This is useful if, for example, the particles are to be heated rapidly at one point along their transit of the compartment, and then allowed to cool slowly while still in transit. If the field strength in the first part is such that electron cyclotron resonance occurs, then large numbers of energetic electrons will be produced and the particles heated. Even a small change in magnetic field strength in the second section, of the order of 1 to 10%, may be sufficient to lose resonance, and reduce the number of energetic electrons so that the particles may cool in a controlled manner. Finally, an important use of the magnetic field in conjunction with the microwave source described below is to create the condition of electron cyclotron resonance, allowing rapid transfer of energy to the electrons.

Heating the particles or otherwise depositing energy within the particles as described above can also be used to drive out unwanted species such as residual hydrogen or hydroxy moieties.

Energetic electrons can be provided by an external microwave source. Thus microwave source 100, which is coupled to processing compartment 45, can be used to increase the energy of electrons within the processing compartment 45 which in turn transfer energy and charge to particles also moving through processing compartment 45 upon collision with the electrons. Microwave source 100 is operated at a power range of about 1 to about 1000 Watts depending on a number of variables including the pressure of the gas, the volume and construction of the chamber, RF losses, and if a cyclotron resonance is used, the magnetic field homogeneity, and/or amount of detuning from resonance.

In the presence of a microwave field, the magnetic field discussed above can be adjusted with a certain relationship to the frequency of the microwaves to produce electron cyclotron resonance (ECR) of the electrons, or protons respectively. With ECR, the energy of the charged species rapidly increases and their ability to heat, ionize, or otherwise modify the copropagating particles is greatly enhanced. Collisions of high energy electrons with atoms or molecules can produce large numbers of ions and additional electrons. Additional radiofrequency (RF) power at a frequency much lower than the microwaves can bring these ions to high energy for processes such as annealing and implantation.

Electron cyclotron resonance energizing of electrons can also be used to generate more electrons since each electron thus energized that collides with the container wall, a particle, or a gas atom, produces multiple secondary electrons, thus further increasing the capacity to heat and to modify the charge of the particles by electron impact.

Microwaves can be used to pump large amounts of energy into the electrons in the compartment. While non-resonant excitation is effective, Electron Cyclotron Resonance can be extremely effective at replenishing electron energy. As discussed earlier, a magnetic field strength of 0.1 Tesla or 1 kilogauss would confine electrons accelerated by 20,000 Volts to a helical orbit of a diameter of 1 centimeter or less. At this field strength excitation of the particle processing compartment by a microwave frequency of about 2.8 Gigahertz would induce cyclotron resonance and rapid increase in electron energy. In this case, only a small fraction of the electrons previously required are now needed. This is because each electron after loosing energy in a collision would be rapidly re-accelerated. Any secondary or stray electrons would also be accelerated to high energy corresponding to many thousands of Volts of acceleration potential.

While Electron Cyclotron Resonance produces a large number of energetic electrons, some particle processing techniques, such as annealing and implantation, require energetic ions. If low extraction and acceleration potentials are used to achieve low particle velocity, then ions may not be available with sufficiently high energy for certain kinds of particle processing. Any technique known in the art of plasma production could be used to add energy to the ions in the cyclotron mode. One skilled in the art of plasma manipulation or particle acceleration would note that if a second, much lower frequency Radio Frequency (RF) signal were applied to the cavity, for example by dividing the conducting shield into halves along a plane intersecting its axis, and driving the two halves with an RF frequency, then both electrons and the ions they produce could be accelerated by cyclotron resonance. Alternatively, a solenoidal coil, either inside or possibly outside the shield, could magnetically couple to a plasma to accelerate ions as well.

For example, at a field strength of 0.5 Tesla or 5 kilogauss, a microwave frequency of 13.5 GHz would induce electron cyclotron resonance, while a second RF signal at 1.9 MHz would simultaneously induce ion cyclotron resonance for singly charged He4. Electrons accelerated by a 20,000 Volt potential would have a helical orbit with a diameter of less than 1 millimeter, while simultaneously, singly charged He4 ions would have an orbit of less than about 1.6 centimeter.

Heating the particles or otherwise depositing energy within the particles as described above can also be used to drive out unwanted species such as residual hydrogen or hydroxyl moieties.

The particles and charged species exiting the exit aperture 50 of the processing compartment 45 can be decelerated to a specific velocity by a deceleration electrode 60. Deceleration electrode 60 is located about 2 cm to about 20 cm or more downstream from and adjacent from exit aperture 50 of processing compartment 45.

Deceleration electrode 60 can consist of any deceleration device known in the art, including a conducting mesh, or an aperture in a shaped conducting electrode. The electrode is biased with electrical potential primarily to decelerate particles, and potentially to stop ions and electrons. For example, if the charge to mass ratio of a particle remains unchanged from the initial extraction from the particle source throughout its entire transit through the apparatus, past the deceleration electrode, then a deceleration potential equal to the extraction potential plus the acceleration potential in magnitude and opposite in sign will bring the particle to essentially zero velocity.

A power supply is used to bias the electrode appropriately. Positively charged species can be decelerated by the electrode by applying a potential of about 100 Volts to about 400,000 Volts. Conversely, negatively charged species are decelerated by applying a potential of about −100 Volts to about −400,000 Volts.

In a manner similar to that described for the extraction and acceleration apertures, the deceleration electrode may also serve as an orifice to limit the flow of gas between the deceleration volume and the drift volume, allowing a high pressure in one and an acceptable vacuum in the other, in a manner similar to that described for-the acceleration electrode.

Figure 3:
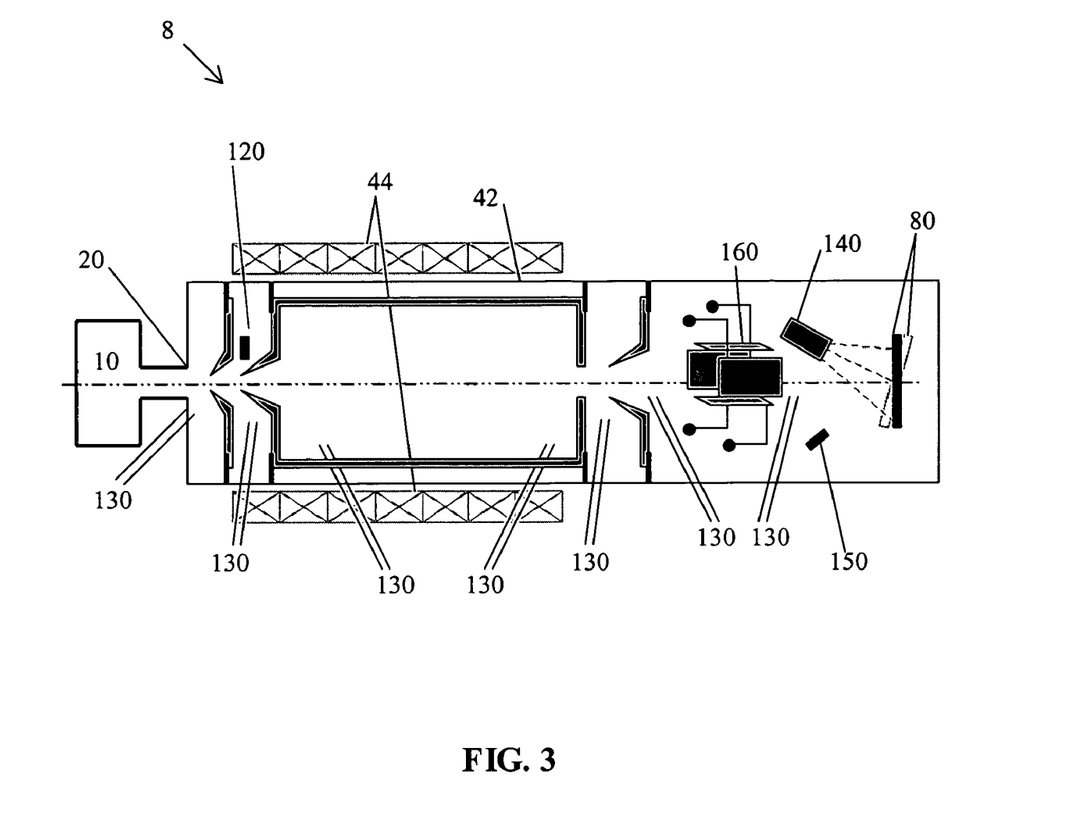
FIG. 3 is a schematic diagram illustrating additional components used when depositing particles as a film on a substrate.

Particles that are processed by the apparatus of the invention can, for example, be collected in a container, subjected to subsequent processing steps, deposited on a substrate, or reprocessed in the apparatus of the present invention. When the particles are deposited on a substrate 80, the substrate can optionally be tilted or otherwise rotated, heated, and/or moved to provide additional control of film formation. The substrate may also be tilted and rotated as it is struck by the particles in order to provide greater conformality, i.e. more even coverage of the particles over the topography of the substrate.

A flux of electrons or positive ions can be used to neutralize the accumulation of electrical charge on the substrate in order to avoid electrical breakdown and damage.

Additional Components

Other optional components which can be included in apparatus 8 are schematically depicted in FIG. 3. These components include: a secondary deposition system 140, a charge neutralization system 150, and/or a scanning deflectors 160.

A secondary deposition system 140 can optionally be placed downstream of the deceleration electrode 60 (between the deceleration electrode and the substrate) to provide an additional source of material to be collected or deposited alternately or concurrently with the particles. The secondary deposition system may, for example, be any of the possible systems described earlier in this application, both as particle producing systems and ion producing systems that allow for example secondary depositions of boron, phosphorous, alumina, or sputtered $ErF_3$ or $Er_2O_3$.

A charge neutralization system 150 induces a current upon a substrate equal in magnitude and opposite in sign to that of the charged particles striking the surface so that the net current on the surface is close to zero. Since many deposited films will be insulating, any current could result in a build-up of charge until a potentially catastrophic electrical breakdown would occur, damaging the film. Negative current is traditionally supplied by electrons, while either negative or positive current may come from a source of non-reactive ions.

The apparatus of the invention can include an optional scanning deflector 160. Scanning deflector 160 can be used to distribute the narrow beam of particles (which is typically a few centimeters in diameter) over a much larger substrate, including wafers of 20 to 30 centimeters in diameter or even large format display substrates of the order of a meter or more in size. The scanning system may also be used to scan a beam of particles over a substrate independent of the substrate size and even if the beam spot is much larger, in order to produce a more uniform distribution. Scanning deflector 160 may also be used as a deflector; switching the particles beam from one direction to another so that particles are not deposited or collected while adjustments to the apparatus are made.

Figure 4:
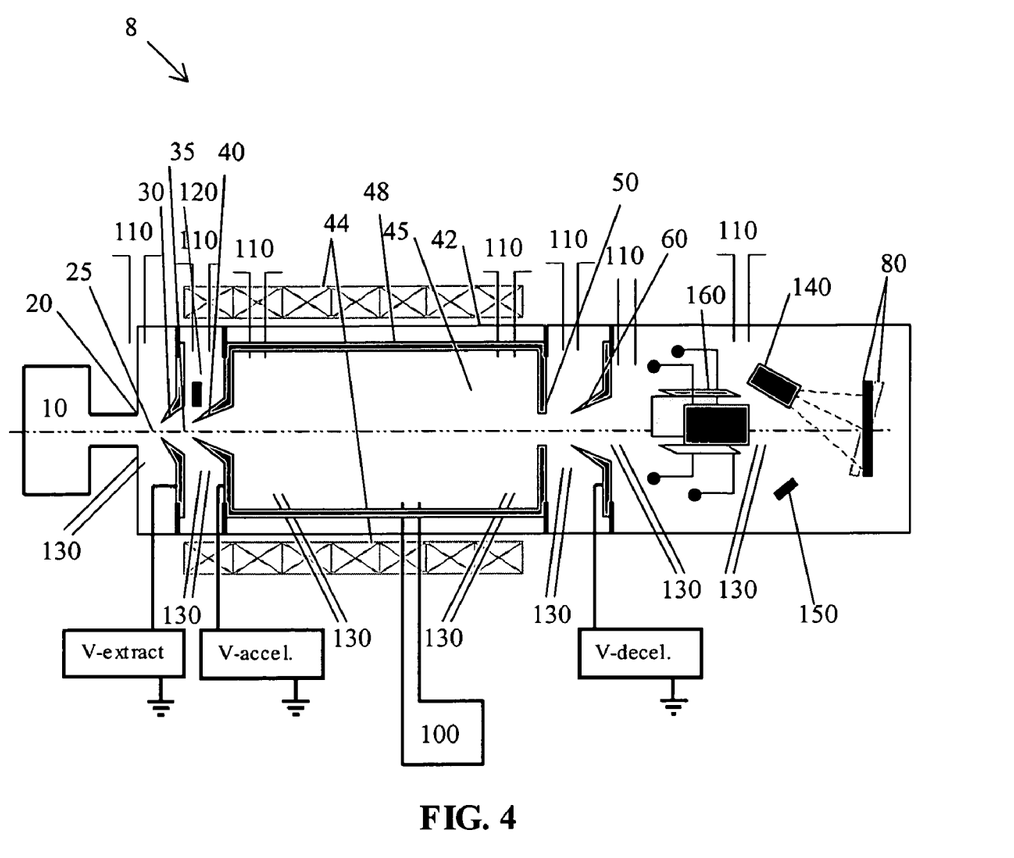
FIG. 4 is a schematic diagram illustrating the apparatus of the invention including the various components described.

FIG. 4 is a representation of the apparatus of the invention, including the various components described above. In operation, each of the above described components of the apparatus of the invention provides a mechanism for controlling the structure and properties of particles produced by a particle source. The components of the apparatus can be used cooperatively in a variety of ways or they can be used independently. As will be apparent, the combinations that are possible are large. Some of the possible particle manipulations that can be conducted using the apparatus of the invention are illustrated in the following examples. These examples are not intended to limit the scope of the invention in any way and are provided for illustrative purposes.

EXAMPLES

Example 1

General Example Relating to Second Thermal History

The ability to control the thermal evolution of particles by rapid or gradual heating, rapid or gradual cooling, or by maintaining particles at a fixed temperature as they move through the process volume, as described above, allows the creation of a second thermal history for the particles. The fact that they are moving through vacuum or low pressure separately and do not come into contact allows for very high temperature processing without agglomeration. This can, for example, permit the selection of a state for the particles between various possible states, such as single crystal, polycrystalline, segregated amorphous, and homogenous amorphous (glassy), and the like. The ability to heat and/or control the cooling of the particles also allows for control of compositional evolution such as the evaporation of an undesired external coating or the growth or removal of an external coating through reactions of the hot particles with an additional low pressure gas in the processing region introduced by a gas source 130. For example, a particle can be quickly melted, achieving a spherical shape by surface tension, and then as it moves along, allowed to slowly cool. This can be done by achieving complete electron cyclotron resonance at the start of the processing compartment where the particles would thus receive a rapid heating effect. The magnetic field is then changed, allowing the field to go "off resonance" in the downstream part of the chamber. As the magnetic field deviates more from resonance, the electron energy and number decreases, allowing the particles to cool. One benefit to the spherical shape during processing is the narrowing of the charge state distribution. Charge-setting mechanisms are mostly surface-area dependent, and since the surface area and mass of a sphere of a given material is a well determined relationship, the charge state is more closely correlated to mass than for an irregularly shaped particle.

Example 2

Separation and Transport of Hot Particles from Process Gasses and Other Products with Minimal Thermal Processing and Setting of Final Velocity Acceleration and transport of hot particles from source to target with minimal cooling or minimal changes in internal structure or composition can be achieved by accelerating the particles to high speed upon exiting the particles source. This has two effects: 1) minimizing the transit time and thus minimizing the cooling, and absorption of contaminants, and 2) resetting the velocity of the particles to the desired value decoupled from the high velocity used during transport.

Thus, charged species are extracted from the particle source by applying an extraction potential of at least 10,000 Volts. Additional ions or electrons can optionally be added using the ion/electron source which impart additional thermal energy and/or charge in order to maintain the temperature and maximize the accelerated velocity, respectively. The extracted species are then rapidly accelerated by applying an acceleration potential of about 100,000 to about 400,000 Volts to the acceleration electrode. The accelerated species travel at a velocity that is sufficient to minimize particle cooling or compositional changes, such that only a small additional amount of heating from electrons or ions is required. The particles therefore strike a target (for example a substrate) while hot. The deceleration potential is adjusted to achieve a relatively low final velocity. The value of the deceleration potential depends on many factors, primarily the change in charge to mass ratio of the particle along its path between the particle source and the deceleration electrode.

Example 3

Particles with Additional Thermal Processing and Time for Structural or Chemical Modification such as Thermal Annealing Particles which receive additional thermal processing beyond that which has occurred upon extraction from the particle source can be prepared according to this example. Charged species are extracted from the particle source by applying an extraction potential of about 100 to about 10,000 Volts. Additional ions or electrons are optionally added to the species beam using the ion/electron source. The particles are either minimally accelerated or decelerated into the processing compartment by applying a potential to the acceleration electrode of between about −10,000 and about +10,000 Volt, or are allowed to enter the compartment without change in velocity. Additional heat is applied to the slow moving particles by collisions with energetic electrons or ions accelerated by ECR or ICR respectively under conditions similar to those previously described. The magnetic field has the effect of confining the electrons near the axis of the apparatus to helical orbits remaining near the axis and increasing the probability of collisions between the electrons and propagating particles, providing a mechanism for adding additional thermal and non-thermal energy to the particles. The process may be enhanced by application of microwave power of between 1 and 1000 Watts to the processing compartment which would rapidly energize electrons present and re-accelerate scattered electrons, thus maintaining or increasing the temperature of the particles through electron heating. This added energy is transferred to the propagating particles by collisions between the confined electrons and the particles. Heating of the particles also has the added benefit of driving out residual hydrogen or hydroxyl species, which may be abundant in material produced in aqueous reactions such as Sol-Gels.

The particles may be further heated by energetic ion bombardment which may also be used for non-thermal heating and energy deposition, densifying certain materials as well. The heated particles are then collected or deposited on a substrate at the output. The thermal processing may include an annealing step such that the particles are first heated above their initial temperature, and then allowed to cool at a slow, controlled rate. This is accomplished by driving the magnetic coils with different currents such that the conditions for ECR occur in the first part of the processing compartment only. In the downstream region, the magnetic field is detuned from ECR conditions by an amount which varies the electron number and energy and thus the cooling rate of the particles.

Example 4

Cool Particles from a Source of Hot Particles.

Particles emerging from an in situ particle source may be very hot, and require time to cool, under vacuum or special ambient condition, before collection in order to maintain a spherical or other shape, or simply to prevent sticking, agglomeration or forming a semi-solid mass. Charged species are extracted from the particle source by applying a potential at the extraction electrode of about 1000 Volts, and then slowed by an appropriate acceleration potential so that they drift relatively slowly within the processing compartment. The charged species are allowed to drift through the processing compartment under their own velocity. This slow drift allows the particles to cool and provides time for other processing such as surface treatment or heavy doping by implantation. The cooled, structured particles can then be collected or deposited on a substrate at the output.

Exemplary embodiments of the present invention have been illustrated and described. It will be understood, however, that changes and modifications may be made to the invention without deviating from the spirit and scope of the invention, as defined by the following claims.

The invention claimed is:

1. An apparatus for processing charged particles composed of a plurality of atoms and/or molecules (atomic or molecular clusters) comprising, in combination:
   (a) a particle source having an exit aperture;
   (b) an extraction electrode located adjacent to the exit aperture;
   (c) an acceleration electrode located adjacent to the extraction electrode;
   (d) a processing compartment located adjacent to the acceleration electrode; and
   (e) a deceleration electrode located adjacent to the processing compartment.

2. The apparatus of claim 1 wherein the processing compartment comprises a metallic chamber surrounded by conducting coils.

3. The apparatus of claim 1 further comprising an ion source located between the exit aperture and the extraction electrode.

4. The apparatus of claim 1 further comprising an electron source located between the exit aperture and the extraction electrode.

5. The apparatus of claim 1 further comprising a microwave source coupled to the metallic chamber.

6. The apparatus of claim 1 further comprising one or more gas sources.

7. The apparatus of claim 1 wherein the particle source provides particles by a process selected from the group consisting of flame hydrolysis, plasma generation, sputtering, laser ablation into vacuum, a gas or a liquid, colloidal formation, and gas phase nucleation.

8. The apparatus of claim 1 wherein the particle source is a delivery system for particles previously produced.

* * * * *